(12) United States Patent
Khare (10) Patent No.: US 10,305,454 B2
(45) Date of Patent: May 28, 2019

(54) HIGH STABLE OSCILLATOR FOR VARIOUS OPERATING MODE

(71) Applicant: MegaChips Corporation, Osaka (JP)

(72) Inventor: Abhishek Kumar Khare, Bangalore (IN)

(73) Assignee: MegaChips Corporation, Osaka (JP)

(*) Notice: Subject to any disclaimer, the term of this patent is extended or adjusted under 35 U.S.C. 154(b) by 174 days.

(21) Appl. No.: 15/403,393

(22) Filed: Jan. 11, 2017

(65) Prior Publication Data

US 2017/0288651 A1    Oct. 5, 2017

(30) Foreign Application Priority Data

Mar. 30, 2016   (IN) ............................... 201611011147

(51) Int. Cl.
| | | |
|---|---|---|
| H03K 3/03 | (2006.01) | |
| H03K 3/011 | (2006.01) | |
| H03L 1/00 | (2006.01) | |

(52) U.S. Cl.
CPC ........... *H03K 3/0315* (2013.01); *H03K 3/011* (2013.01); *H03L 1/00* (2013.01)

(58) Field of Classification Search
CPC .. H03K 3/0315; H03K 3/0322; H03K 3/0311; H03L 1/02
See application file for complete search history.

(56) References Cited

U.S. PATENT DOCUMENTS

| | | | | |
|---|---|---|---|---|
| 6,157,180 A | * | 12/2000 | Kuo ........................ | G05F 3/242 323/282 |
| 6,496,056 B1 | * | 12/2002 | Shoji ...................... | H03K 3/011 327/543 |
| 7,586,380 B1 | | 9/2009 | Natarajan et al. | |
| 2008/0061893 A1 | * | 3/2008 | Lakshmikumar .... | H03K 3/0315 331/57 |
| 2015/0137896 A1 | * | 5/2015 | Gajda ....................... | H03L 1/02 331/57 |

FOREIGN PATENT DOCUMENTS

EP    1523806 B1    12/2007

OTHER PUBLICATIONS

Yao Wang et al.; "An Ultra-Low-Power Oscillator with Temperature and Process Compensation for UHF RFID Transponder"; Radioengineering; vol. 22, No. 2; pp. 505-510; Jun. 2013 (6 pages).

* cited by examiner

*Primary Examiner* — Ryan Johnson
(74) *Attorney, Agent, or Firm* — Osha Liang LLP (57) ABSTRACT

A frequency stable oscillator with compensation circuit, the device includes a ring oscillator circuit having S number of stages, a current generator circuit configured to generate a first current, a replica circuit having an inverter with output connected to input, configured to generate a first voltage upon dumping a second current onto the replica circuit, a first operational transconductance amplifier (OTA) with an input as the first voltage, configured to generate a third current and a current mirror circuit configured to generate a fourth current by adding the first current and the third current in a particular ratio M:N, wherein the inverter of the replica circuit is equivalent to a single stage of the ring oscillator circuit and wherein the fourth current is the total current for the ring oscillator circuit and is as close as possible to S times the second current.

26 Claims, 9 Drawing Sheets

Conceptual block diagram (Whole Circuit)

Fig.1 Conceptual block diagram (Whole Circuit)

Fig. 2 Ring Oscillator Circuit

Fig. 3 Current Generator 101

Fig. 4 Trimmable RP Poly Resistor 401

Fig. 5A Ibias OTA 501

Fig. 5B V2I OTA 502

Fig.6 Concept of a stage in Ring Oscillator

Fig.7 Concept of PTAT current source

Fig. 8 Temperature characteristics of currents I_ntat_ring and I_ptat_ring

HIGH STABLE OSCILLATOR FOR VARIOUS OPERATING MODE

FIELD OF THE INVENTION

The present disclosure relates to oscillators having frequency stability, and more particularly to on-chip oscillator with high frequency stability across process, voltage and temperature (PVT) variations at low power.

BACKGROUND OF THE INVENTION

In digital electronics, a ring oscillator with odd number of stages of inverter (NOT Gates) is generally used as a source of clock. However, non-crystal oscillators, like the ring oscillators, show huge frequency variations due to variations in device parameters, particularly, temperature, voltage and process. These frequency variations can be as high as 100% and therefore, compensation circuitry is needed to achieve high frequency stability.

In the past, numerous compensation circuits have been suggested for compensation due to variations in process, voltage and temperature (combined PVT) to achieve frequency stability of a ring oscillator. Even though these compensation circuits are able to reduce the frequency variations, they are not able to provide very high frequency stability, at a wide range of operating voltages and temperatures, while consuming very low power. Particularly, conventional compensation circuits in the past do not achieve very high frequency stability, say in the range of less than ±2% frequency variation while operating at voltage range of 1.6 V to 3.6 V, temperature range of 40° C. to 125° C. and consume low power (current of less than 20 μA across entire operating voltage range of 1.6 V to 3.6 V, i.e. in the range of 32 μW to 72 μW).

A publication "An Ultra-Low-Power Oscillator with Temperature and Compensation for UHF RFID Transponder" (Published in: RADIOENGINEERING, VOL. 22, NO. 2, June 2013, wang et al), discloses a low power oscillator with temperature and process compensation. While the circuit uses hybrid resistor string for frequency stability, it does not achieve high frequency stability. Further, operating voltage and temperature range is limited.

U.S. Pat. No. 7,586,380 and EP1523806 disclose circuits for temperature and process compensation for a ring oscillator. However, frequency variation for these oscillators upon compensation is still very wide. Further, these oscillators with compensation circuits consume significant amount of power and therefore are not suitable for low power applications.

Another problem with the compensation circuits known in the art is that their design is not flexible. Particularly, the compensation circuits described in the prior arts are not able perform at different frequencies and are also not portable to various CMOS bulk technologies.

Therefore, there still remains an unfulfilled need of implementing a ring oscillator with compensation for PVT variations at low power consumption. Also, there is a need for compensation circuit design which is highly scalable for generating any stable frequency and easily portable to any CMOS bulk technologies.

In view of the foregoing, there exists a need for an on-chip ring oscillator which has less than 2% frequency variation, over wide supply voltage range (1.6V to 3.6V), temperature range (−40 C to 125 C) and process variation without using any external (off-chip) component (resistor or capacitor) in any bulk CMOS technology. Also, the aim of the invention is to achieve this less than 2% frequency variation, preferably less than 2%, at very low power consumption and scalability to any stable frequency.

SUMMARY

The present disclosure provides a device and a method for frequency stabilization of a ring oscillator by process, voltage and temperature compensation. Existing system for PVT compensation of frequency variation in a ring oscillator do not provide very high frequency stability as well as they consume large amount of power.

One or more embodiments of the present disclosure provides a frequency stable oscillator with compensation circuit, the device includes a ring oscillator circuit having S number of stages, a current generator circuit configured to generate a first current, a replica circuit having an inverter with output connected to input, configured to generate a first voltage upon dumping a second current onto the replica circuit, a first operational transconductance amplifier (OTA) with an input as the first voltage, configured to generate a third current and a current mirror circuit configured to generate a fourth current by adding the first current and the third current in a particular ratio M:N, wherein the inverter of the replica circuit is equivalent to a single stage of the ring oscillator circuit and wherein the fourth current is the total current for the ring oscillator circuit and is as close as possible to S times the second current.

One or more embodiments of the present disclosure provides a method of frequency stabilization of a ring oscillator circuit, the method includes generating a first current by a current generator circuit, generating a first voltage by dumping a second current onto a replica circuit, wherein the replica circuit having an inverter with output connected to input and the inverter of the replica circuit is equivalent to a single stage of the ring oscillator circuit, generating a third current by voltage to current conversion of the first voltage and generating a fourth current by adding the first current and the third current in a particular ratio M:N, wherein the fourth current is the total current for the ring oscillator circuit and is as close as possible to the second current multiplied with number of stages in the ring oscillator circuit.

One or more embodiments of the present disclosure provides a low power frequency stable on-chip CMOS oscillator, the device includes a ring oscillator circuit with S number of stages and each stage having an inverter, a current generator circuit configured to generate a first current, insensitive to power supply variations, a replica circuit having an inverter with output connected to input, configured to generate a first voltage by dumping a second current onto the replica circuit, an operational transconductance amplifier (OTA) with inputs as the first voltage and a bias voltage of a variable resistance with trimmable bits, with bias current as one of the output current of the current generator, configured to generate a third current and a current mirror circuit configured to generate a fourth current by adding the first current and the third current in a particular ratio M:N, wherein the fourth current is the total current for the ring oscillator circuit and is as close as possible to S times the second current, wherein the inverter of the replica circuit is equivalent to a single stage of the ring oscillator circuit and wherein the first and third current are directly and inversely proportional to the temperature respectively.

These as well as other aspects and advantages of the present disclosure will become more apparent to those of ordinary skill in the art by reading the following detailed description, with reference to the accompanying drawings.

BRIEF DESCRIPTION OF THE DRAWINGS

The accompanying drawings constitute a part of the description and are used to provide further understanding of the present disclosure. Such accompanying drawings illustrate the embodiments of the present disclosure which are used to describe the principles of the present disclosure together with the description.

DETAILED DESCRIPTION OF THE INVENTION

The present disclosure relates to on-chip oscillators in bulk CMOS technologies having high frequency stability across process, supply voltage and temperature variations at low power consumption. In the embodiments described hereinafter, the compensation loops for voltage, process and temperature have been described as on-chip elements fabricated on the same chip as the ring oscillator. However, the invention is not limited by implementation of one or more compensation loops as on-chip elements and may be also implemented as external component or on a separate chip as well. Further, while the embodiments of the disclosure hereinafter are shown for a bulk CMOS technology, the same is not limited to the described technology and could be equally applied to any other integrated circuit technologies.

Figure 1:
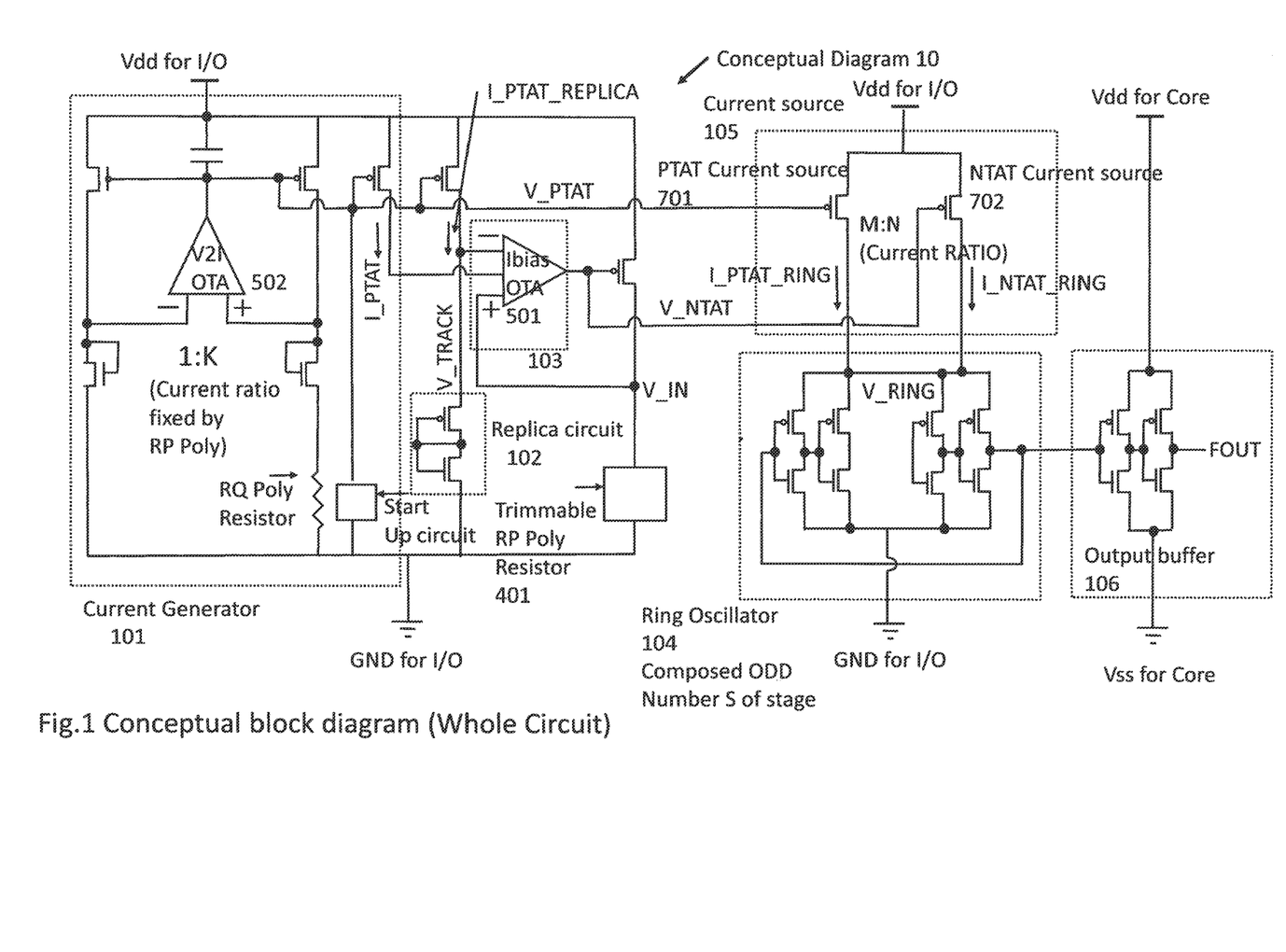
FIG. 1 illustrates a conceptual block diagram of an on-chip oscillator with process, supply voltage and temperature compensation in accordance with an embodiment of the present disclosure.

FIG. 1 is a conceptual circuit diagram 10 of an on-chip oscillator with process, supply voltage and temperature compensation in accordance with an embodiment of the present disclosure. The conceptual circuit diagram 10 consist of a current generator circuit 101 to generate a current insensitive to power supply variation, a process compensation loop with a replica circuit 102 to generate a voltage for tracking process variations, a temperature compensation circuit with Ibias OTA 501, a current source 105 using voltages V_ptat and V_ntat, a ring oscillator circuit 104 and an output buffer 106 using core voltage Vdd. The ring oscillator circuit 104 is a standard ring oscillator with odd number of stages for generating a clock signal.

Figure 2:
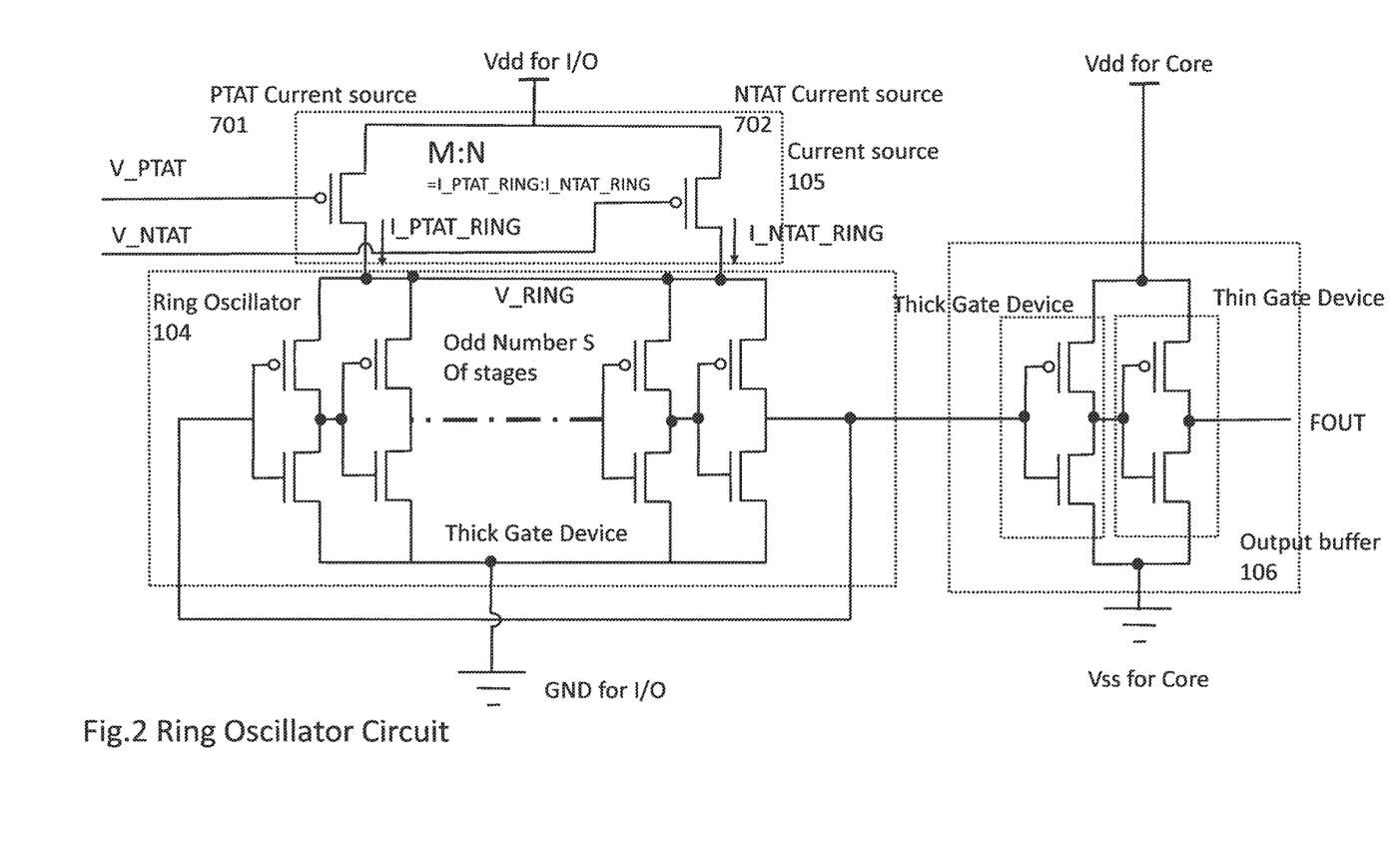
FIG. 2 illustrates a conceptual circuit of ring oscillator with odd number of inverter stages.

FIG. 2 illustrates the ring oscillator circuit 104 with odd number of stages and the output buffer 106. The frequency $F_{out}$ of the ring oscillator is dependent upon number of stages S in the ring, capacitance at the output of each stage of the ring Cload, total current flowing into the ring I_total which is sum of currents I_ptat_ring and I_ntat_ring, and voltage generated by total current flowing into the ring V_ring. Further, FIG. 2 illustrates the output buffer 106 with a thick gate device and a thin gate device. Both the devices are composed by an inverter and supplied by Vdd for Core.

The frequency of the ring oscillator is given by the following equation:

$$Fout = \frac{I\_total}{2*S*Cload*V\_ring} \quad (1)$$

The derivation of equation 1 for output frequency of the ring oscillator is well known to a person skilled in the art and has not been repeated herein for sake of brevity. In order to achieve a stable output frequency, variation in the ring voltage V_ring, due to PVT variation (primarily process and temperature variation) must be compensated. Accordingly, for maintaining stable Fout, the current I_total needs to be changed (increased or decreased) for compensating variation in the ring voltage V_ring.

Figure 6:
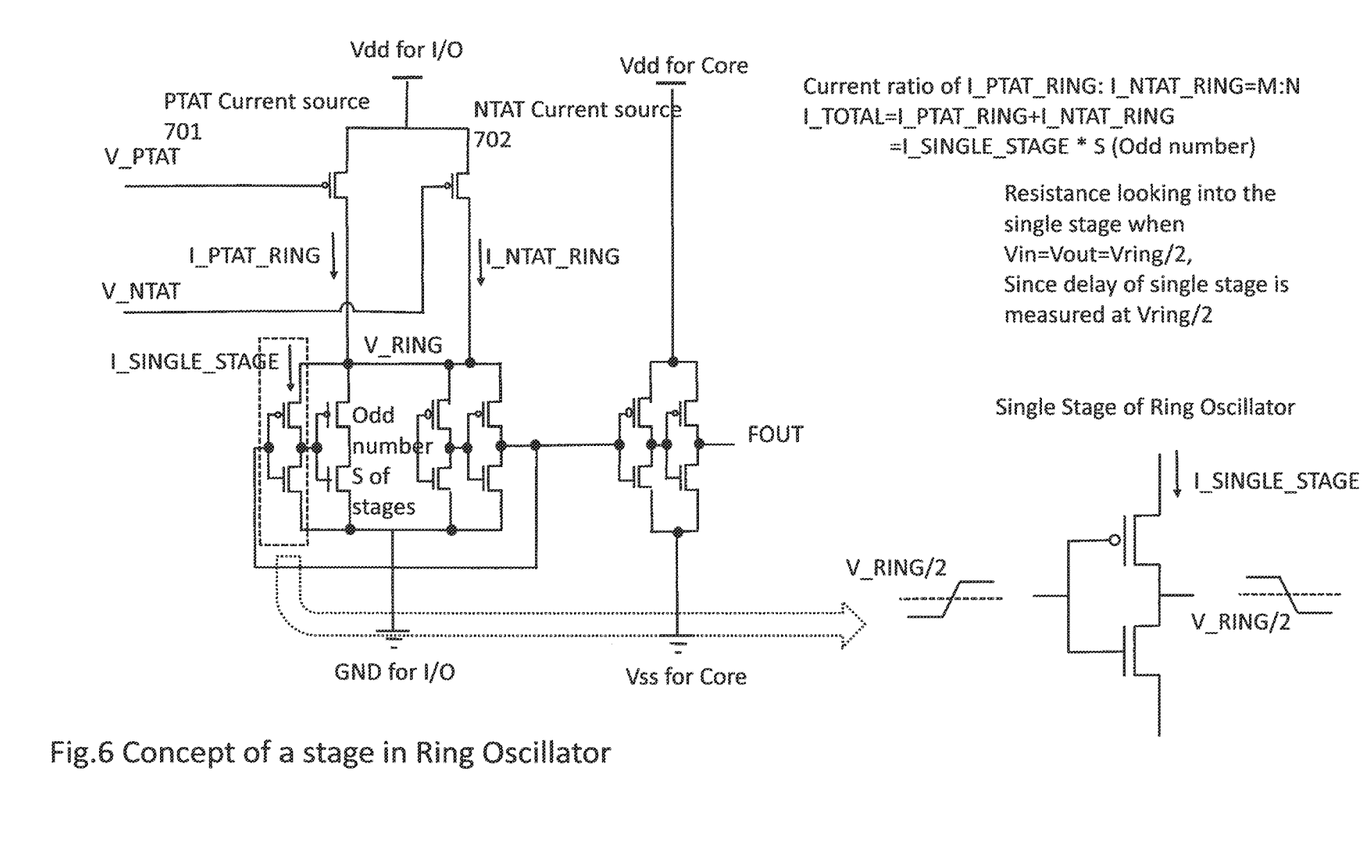
FIG. 6 illustrates a conceptual circuit diagram of the ring oscillator showing resistance looking from the top into a single stage of the ring.

The voltage of the ring circuit V_ring, is dependent upon a current (I_single_stage) flowing into a single stage of the ring and a resistance (Ron_ring) looking into a single stage of the ring shown in FIG. 6, which indicates the concept of the Ron_ring. V_ring and Ron_ring are given by the following equations:

$$V\_ring = I\_single\_stage * Ron\_ring \quad (2)$$

$$Ron\_ring = [1/(gmn+gmp)] \quad (3)$$

where, gmn is the trans conductance of the nmos transistor and gmp is the trans conductance of pmos transistor, when vout=vin=V_ring/2

Returning to the FIG. 2, it further shows the output buffer 106 working as the level shifter at the output of the ring oscillator 104. With the help of the output buffer, output frequency is level shifted to core supply at the output of the ring oscillator with the biasing scheme as shown in circuit diagram. The operation of the output buffer described here is trivial and the disclosure is not limited by the circuit or use of, the level shifter.

Further referring to FIG. 6, the input and output voltage for each stage of the ring is same and pmos and nmos transistors in each stage of the ring oscillator are selectively sized to have switching threshold of Vring/2. Further, since process variation of the transistors causes variation in the transconductance (gmn and gmp), the resistance Ron_ring is dependent upon process parameters. As apparent from equation No. 1, 2 and 3 read together, any variation in the Ron_ring leads to frequency variation and such variation must be compensated to achieve high frequency stability of the ring oscillator.

As described above, FIG. 1 shows various loops working in synchronism for achieving the frequency stability of the ring oscillator. The current generator circuit 101 has been shown in detail in FIG. 3. The current generator circuit 101 generates a proportional to the temperature current I_ptat using current mirror circuit of V2I OTA 502. The current generator 101 has an operational transconductance amplifier (V2I OTA 502) based feedback loop for generating the current I_ptat which is insensitive to power supply voltage variation.

Figure 3:
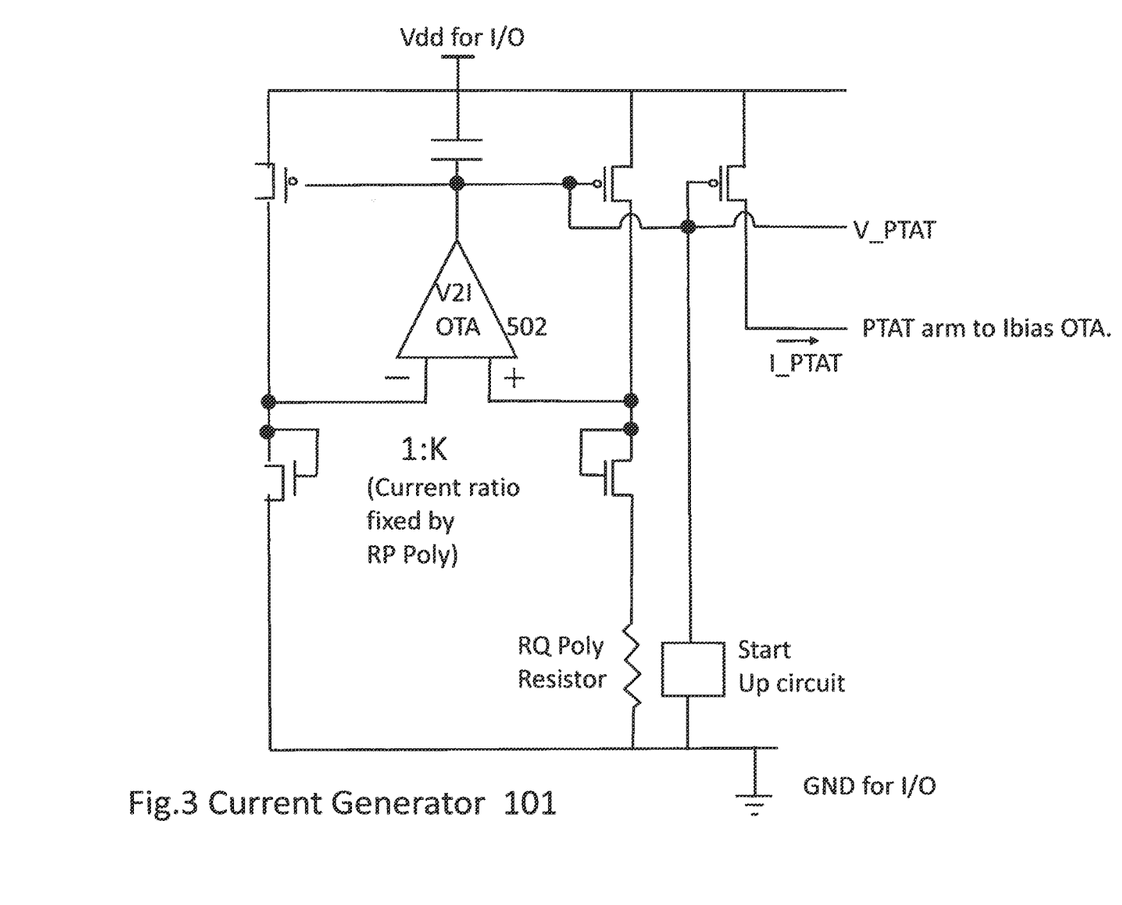
FIG. 3 illustrates a current generator circuit of FIG. 1.

Particularly, the current generator circuit 101 reduces the power supply variation by using V2I OTA 502 based feedback in a 1:K current mirror circuit as shown in FIG. 3. Here the value 'K' of the RQPOLY resistor is selected to achieve a particular ratio. More particularly, the value of 'K' is decided (calculated) upfront and is fixed. Further, a start-up circuit is provided in the current generator to ensure that it does not get stuck in a wrong state at the beginning. Use of start-up circuit with V2I OTA 502 feedback is common and any start-up circuit may be used for this current generator. The invention is not limited by the start-up circuit. The current generator circuit supplies a temperature proportional current I_ptat which is immune to supply voltage variation. The current generator acts as a reference current source for the temperature and process compensation, as explained in the subsequent paragraphs. Further, the functioning of the V2I OTA has been shown in FIG. 5B. V2I OTA 502 has a conventional operation and generates a voltage V_ptat as output. A characteristic of this voltage V_ptat is that it is positively proportional to the temperature.

Returning to the FIG. 1, the usage of Replica circuit 102 is described in detail hereinafter. In general, process variation is the change in the operating characteristics of semiconductor elements (particularly transistors) due to change in its attributes like length, width, oxide thickness etc. Process compensation, as per the present disclosure, is achieved by use of the replica circuit 102 as shown FIG. 1. The replica circuit 102 is equivalent to a single stage of the current starved ring oscillator having output connected to the input. Therefore, as the replica circuit 102 is an inverter with input connected to output and is equivalent to single stage of the ring oscillator 104 i.e. both are using the similarly built inverter(s); the resistance of the replica circuit is equal to Ron_ring. As shown in FIG. 1, a current I_ptat_replica is generated using bias voltage V_ptat of the current generator 101. The current I_ptat_replica is dumped onto the replica circuit 102 and the replica circuit 102 generates a voltage V_track. This voltage V_track is utilized for process compensation as explained hereinafter.

In order to achieve optimal process compensation, the value of voltage V_track have to be as close as possible to the ring voltage V_ring. As the voltage V_track is dependent upon the current I_ptat_replica, the value of the current I_ptat_replica has to be selected such that the voltage V_track remains as close as possible to the ring voltage V_ring. The relationship between the voltage V_track and the current I_ptat_replica is given by the following equation:

$$V\_track = Vthp + Vthn + \sqrt{\frac{2I\_ptat\_replica}{\beta n}} + \sqrt{\frac{2I\_ptat\_replica}{\beta p}} \quad (4)$$

where, Vthp=threshold voltage of PMOS transistor used in replica circuit 102
Vthn=threshold voltage of NMOS transistor used in replica circuit 102
βn=*Cox*(W/L), μn: mobility of electron, Cox gate oxide capacitance, W/L: (width/length) of NMOS transistor used in replica circuit 102
βp*μp*Cox (W/L), μp: mobility of hole, Cox: gate oxide capacitance, W/L: (width/length) of PMOS transistor used in replica circuit 102.

As shown in FIG. 1, the replica circuit 102 is equivalent to a single stage of the ring oscillator. The distinctive feature of this single node in the replica circuit 102 is that its output and input are connected to each other. This configuration of the replica circuit 102 makes it suitable for tracking the process variation of the ring. Particularly, since the replica circuit 102 is equivalent to a single stage of the ring, the process variation similarly affects the replica circuit 102 and the ring. Further, as the process variation of the stages of the ring causes variation in the ring voltage V_ring which consecutively affects the output frequency Fout (as per equation No. 1), a compensation of this voltage variation will ensure frequency stability of the oscillator.

In order to capture the change in ring voltage V_ring due to process variation, the replica circuit 102 is configured as a single stage of the ring with output connected to the input. Therefore, replica circuit's output voltage Vout_replica and input voltage Vin_replica are same and are equal to V_track/2. Therefore, if the voltage V_track V_ring, then Vin=VoutV_ring/2. Since voltage V_track is dependent upon current I_ptat_replica, the circuit configuration appropriately chooses (as explained hereinafter) the current I_ptat_replica to maintain V_track=V_ring. Further, if V_track=V_ring and replica circuit 102 is equivalent to single stage of the ring, the current I_ptat_replica will be equal to I_single_stage.

Particularly, the current I_ptat_replica is a fraction of the total current I_total which goes to the ring. As shown in FIG. 6, total current I_total is going into the ring with resistance Ron_ring and is generating voltage V_ring, further since the replica circuit 102 offers resistance same as Ron_ring, we pump current I_total to the ring which is S times of current I_single_stage, such that V_track=V_ring. Further, since total ring current I_total consists of current I_ptat_ring added to current I_ntat_ring for temperature compensation (as explained later), it is ensured that any PVT variation in I_ptat_replica current on its own leading to a change in V_track is present in V_ring as well, which ensures that V_track V_ring.

When the resistance Ron_ring of the ring changes due to process variation, the ring voltage V_ring as well as the voltage V_track are changed accordingly, since V_ring=V_track. This change in V_track in turn changes the total current I_total flowing into the ring such that the ratio (I_total/V_ring) remains constant. Therefore, as per equation 1, if the ratio (I_total/V_ring) remains unchanged, the output frequency Font will remain stable.

As explained above, the total current flowing into the ring I_total is varied to compensate for the variation in ring voltage V_ring (or V_track, since V_track=V_ring). The variation of the current I_total with respect to change in V_track is explained hereinafter. FIG. 1 shows that the voltage V_track is input to an Ibias OTA circuit 103 which is a current bias (ibias) Operational Transconductance Amplifier (OTA) (501). The Ibias OTA circuit 103 is explained in detail in FIG. 5A which illustrates the Ibias OTA 501 with bias current I_ptat (as shown in FIG. 1) and two inputs voltages V_track for minus node and V_in for plus node. The input voltage V_in is bias voltage of a trimmable RPPOLY resistor 401 (shown in FIG. 4) which has a positive temperature coefficient. The trimmable RPPOLY resistor 401 is an on-chip variable resistance with trimmable bits. The trimmable bits are provided to compensate any variation in the value of on-chip resistance. However, the invention is not limited to the use of the resistance trimmable RPPOLY resistance 401 with trimmable bits and any other resistance; either on-chip or off-chip, with or without the trimmable bits may be used. Nevertheless, a typical trimmable RPPOLY resistor circuit 401 has been shown in FIG. 4.

Figure 4:
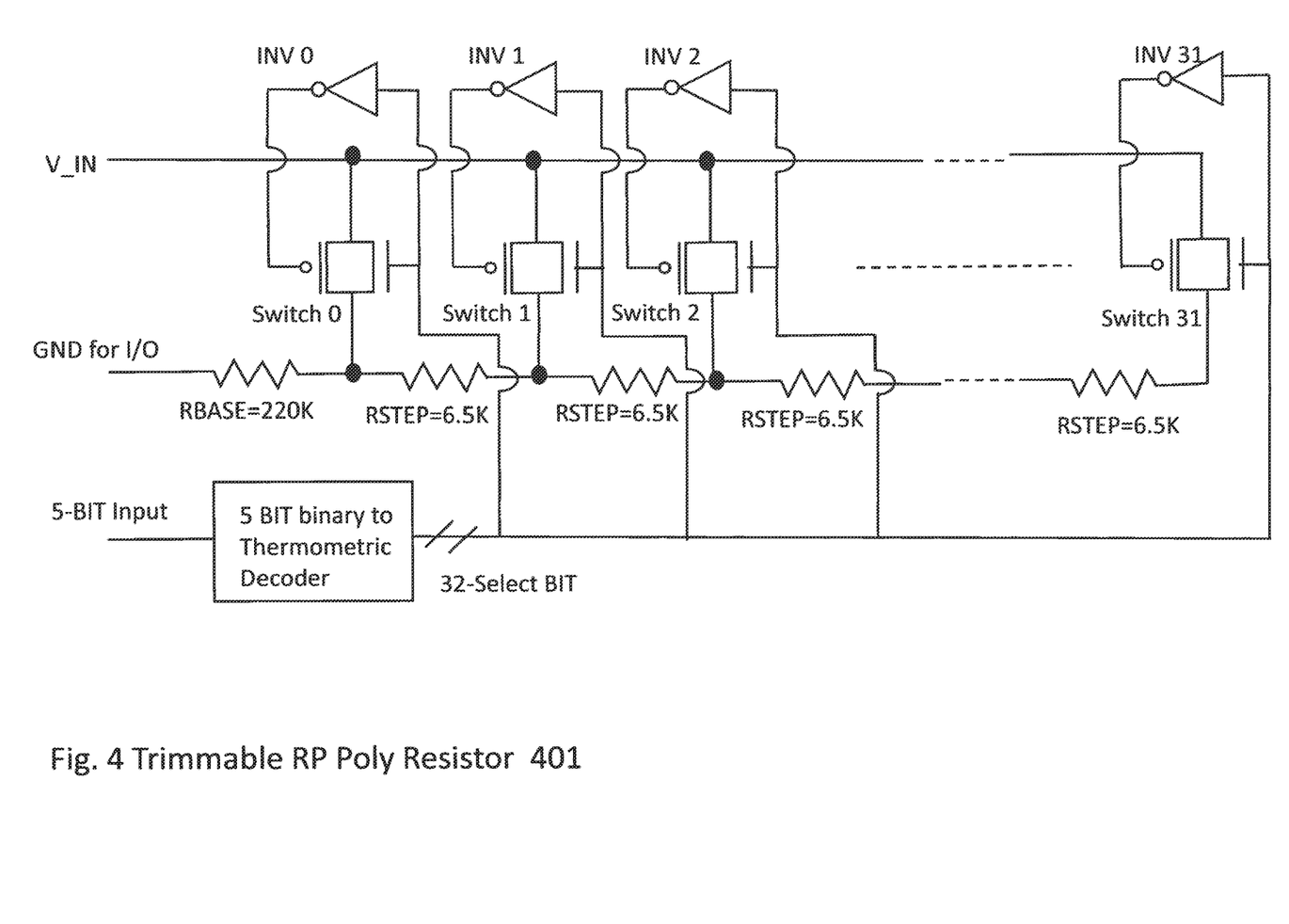
FIG. 4 illustrates a RPPOLY resistor circuit with trimmable bits.

A resistor ladder, as shown in FIG. 4, is a combination of resistor segments connected in series. For example, it consists of a base resistor segment RBASE=220K and other 31 segments are labelled as RSTEP=6.5K. The decoding of 5-TRIM bits obtained from the c-fuse bank is done using the 5 bit decoder as shown in FIG. 4 to generate 32 bits. The decoding is done such that at any time only one of the 32 output bits is ON (HIGH) and rest all are zero. The bit which is ON determines the point at which the resistor ladder is tapped to the switch and connected to node. For example, if the input TRIM code is 00000 then decoder shall make only Switch0-1 and all other 31 bits shall be zero. This will make the resistor ladder get connected to V_in after RBASE itself and so the effective resistance between V_in and IO_GND pins shall be RBASE=220K. In case the code selected by trim bits is 01111, then the Switch from 0 to 15=1 and all other select bits shall be Zero. This will ensure that the resistor ladder is tapped from a point such that the total resistor between V_in and IO_GND is equal to RBASE=220K+(14 segments of RSTEP=6.5K)=311K. This way the resistor value between V_in and IOGND can be tuned from 220K to 421.5K in steps of 6.5K. See Table 1 below:

TABLE 1

Resistor ladder Programmability

| TRIM [4] | TRIM [3] | TRIM [2] | TRIM [1] | TRIM [0] | Reff (Typical) |
|---|---|---|---|---|---|
| 0 | 0 | 0 | 0 | 0 | 220K |
| 0 | 0 | 0 | 0 | 0 | 220K + 6.5K |
| . | . | . | . | . | . |
| . | . | . | . | . | . |
| 1 | 1 | 1 | 1 | 0 | 220K + 30*6.5K |
| 1 | 1 | 1 | 1 | 1 | 220K + 31*6.5K |

Figure 5A:
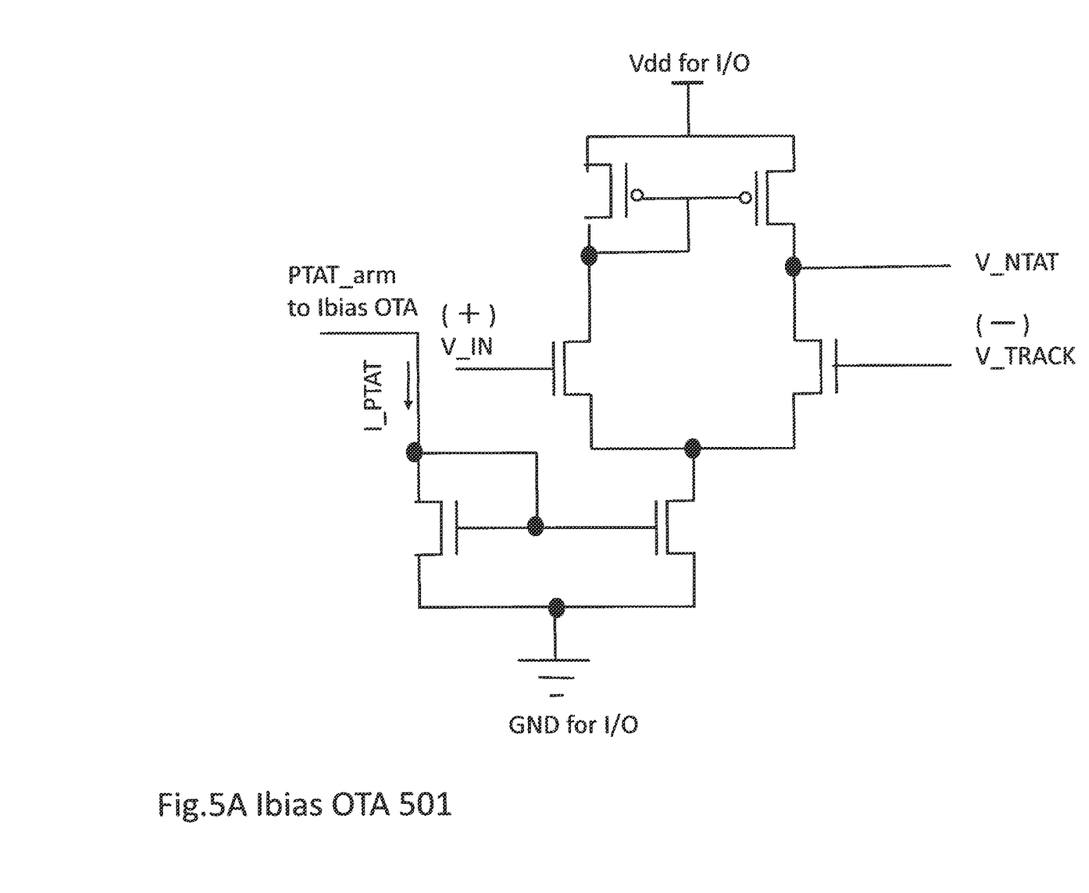
FIG. 5A illustrates a Ibias OTA circuit.
Figure 5B:
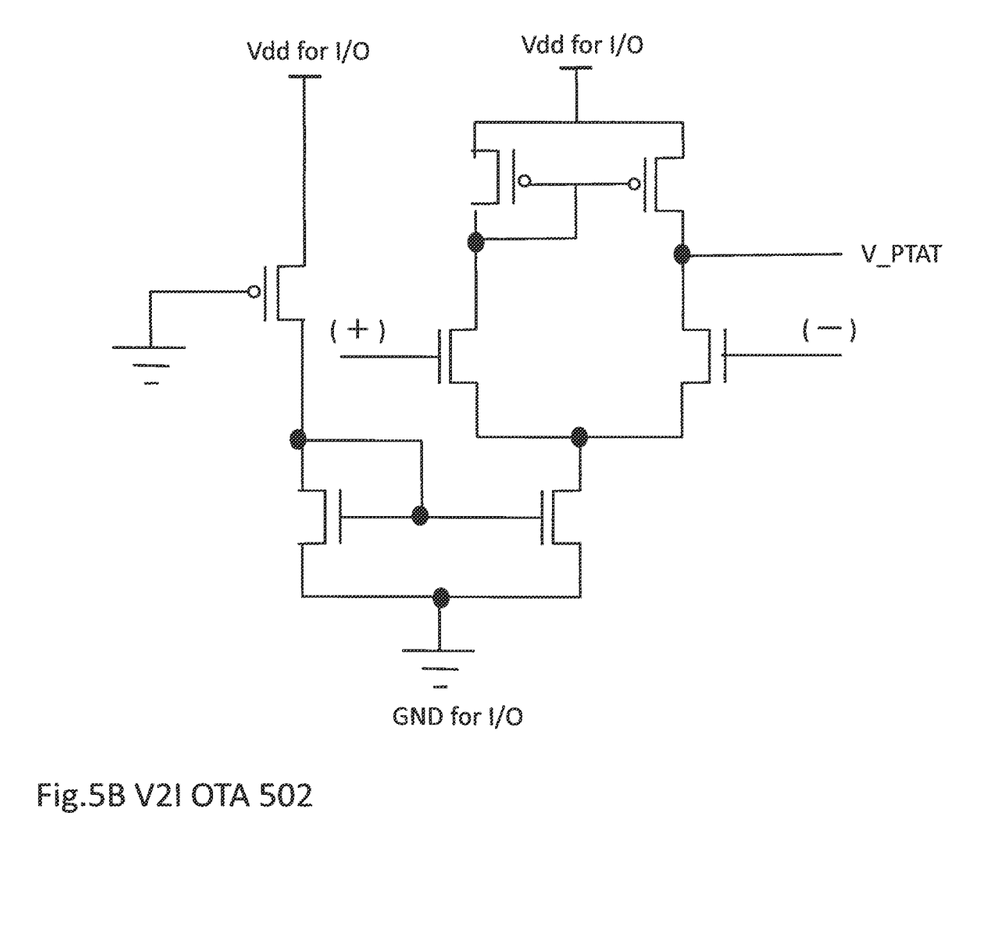
FIG. 5B illustrates a V2I OTA circuit which is a current bias (Ibias) Operational Transconductance Amplifier (OTA)

The functioning of the Ibias OTA 501 is described in FIG. 5A hereinafter. FIG. 5A shows Ibias OTA 501 which has a conventional operation and generates a voltage V_ntat as output. Also the current source of Ibias OTA 501 is supplied the current I_ptat. Further, positive node of the Ibias OTA 501 is connected with V_track and negative node of the Ibias OTA 501 is connected with voltage V_in. A characteristic of this voltage V_ntat is that it is inversely proportional to the temperature. The voltage V_ntat is generated from the voltage Vtrack (using the Ibias OTA 501) and will compensate for the process variation as a current (I_ntat_ring) to the ring circuit.

Figure 8:
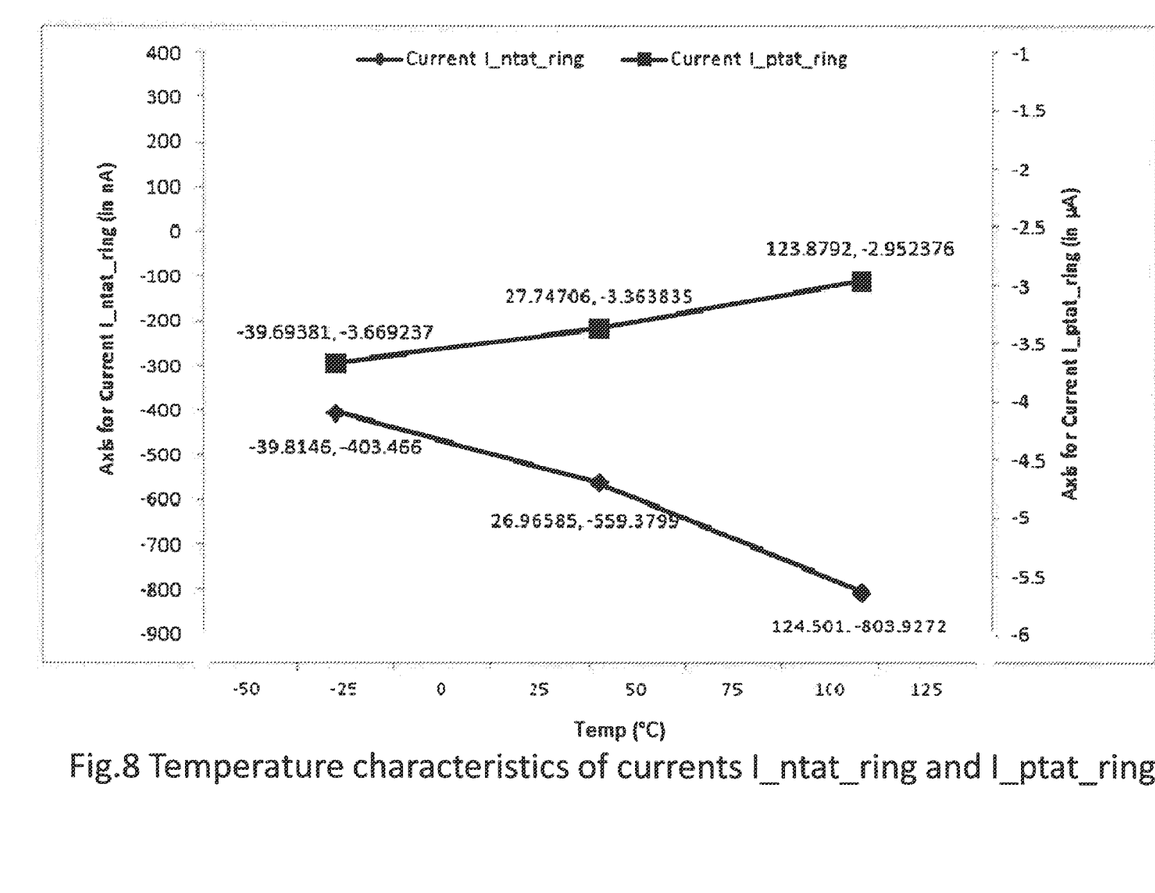
FIG. 8 is graph plotting the temperature characteristics of currents I_ntat_ring and I_ptat_ring.

Also since the current I_ntat_ring is inversely proportional to temperature (as voltage V_ntat is inversely proportional to temperature), a temperature compensation is required before this current is used for process compensation. Particularly, the temperature characteristic of the current I_ntat_ring has been plotted in FIG. 8 which clearly depicts that this current I_ntat_ring is inversely proportional to the temperature. FIG. 8 also plots the temperature characteristics of the current Iptat_ring and clearly depicts that this current Iptat_ring is directly proportional to the temperature.

In the results of the above operations, as the temperature characteristics for the two currents I_ptat_ring and I_ntat_ring are opposite, a combination thereof will generate a current which will compensate the temperature variation. Particularly, the current I_total flowing into the ring for process compensation should be combination of both I_ptat_ring and I_ntat_ring for achieving temperature compensation as well as the process compensation. Accordingly, the current I_total is addition of currents I_ptat_ring and I_ntat_ring in a particular ratio (M:N) and has been explained in FIG. 7.

Figure 7:
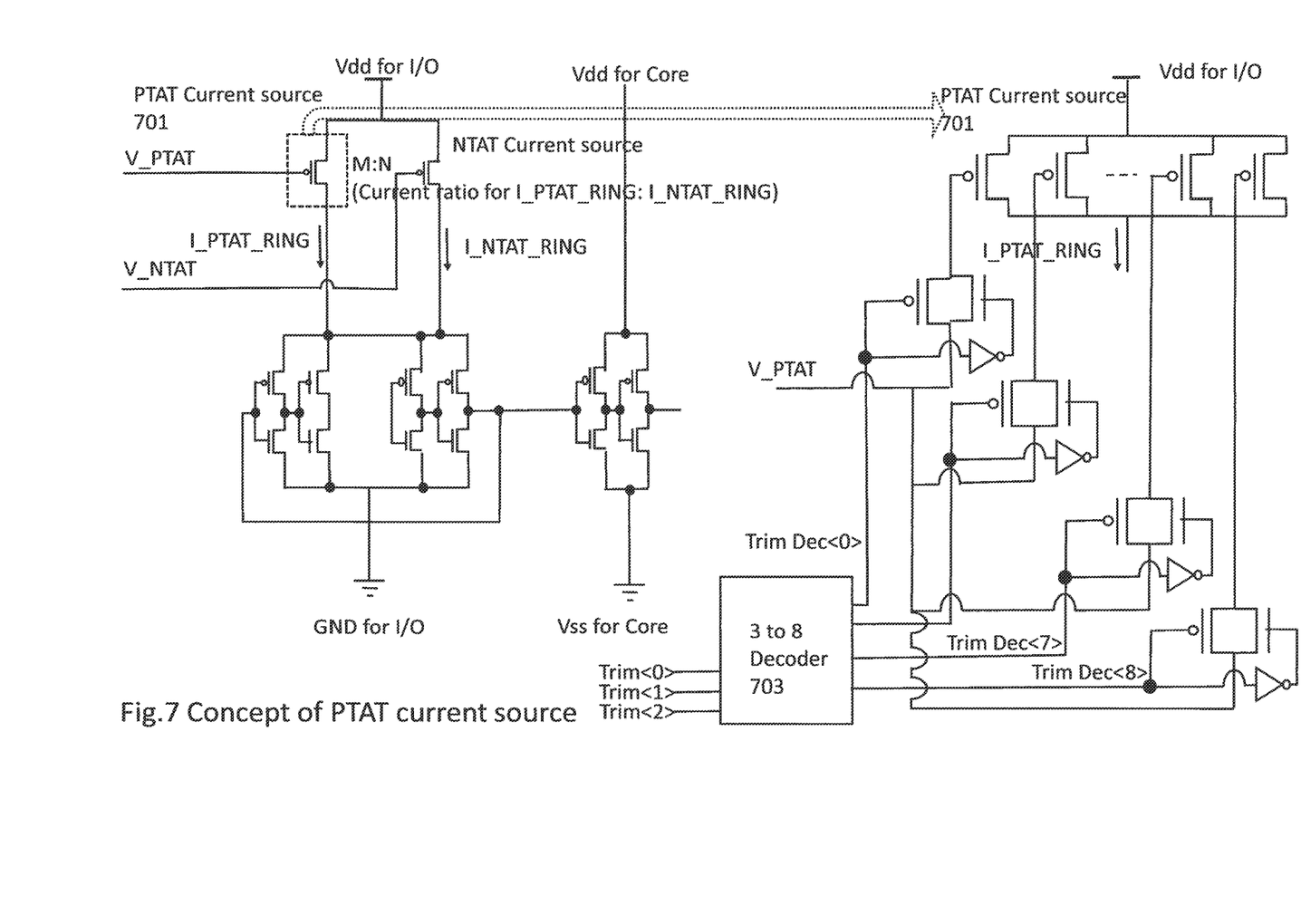
FIG. 7 shows a PTAT current source which is going into the ring oscillator with Trimmable decoder.

FIG. 7 shows the concept of PTAT current source to explain the ratio and current I_total. The ratio M:N is selected to overcome any unforeseen silicon related issues in temperature coefficient. FIG. 7 exemplarily shows 8 arms for PTAT current source 701, however, the invention is not limited by the said number of arms. FIG. 7 shows the current I_ptat_ing with 3 trim bits which are inputted to a 3-to-8 decoder 703 and are used for selecting the number of arms that should be turned ON for PTAT current source. As shown in FIG. 7, combination of trim bits switches on/off corresponding transistors and I_ptat_ring is selected accordingly. Likewise, a combination of 3 trim bits is used for selection of current I_ntat_ring and on basis for the trim bits, the ratio MN is selected. This ratio MN is once selected at the testing stage and then burned as a fixed value for the operation of the ring oscillator.

As explained in the operation for circuit 10 described in FIG. 1, voltage, temperature and process compensation loops work in synchronism and generate a stable output frequency for the ring oscillator. A typical ring oscillator implemented with the compensation technique described with the present disclosure achieves less than ±2% frequency variation over a voltage range 1.62V to 3.6V, temperature range −40 to 125° C. and across all possible process variations while consuming low power, in range of 32 μW to 72 μW. A typical ring oscillator implemented with the compensation technique described with the present disclosure operates at a frequency of 131.072 KHz or 36.864 MHz.

The disclosure should not be regarded as being limited to the embodiments described in above rather various modifications and combinations may be carried out without departing from the spirit of the invention. For example, the trim bits for the resistor ladder shown in FIG. 4 and/or the trim bits for the current source as shown in FIG. 7 may be obtained from the on-chip e-fuse bank or any other on-chip or off-chip circuitry. The invention should not be regarded as being limited to the embodiments described in above or to the modifications suggested above but various modifications and combinations may be carried out without departing from the scope of the following claims.

What is claimed is:

1. A frequency stable oscillator with compensation circuit comprising:
    a ring oscillator circuit comprising S number of stages;
    a current generator circuit configured to generate a first current;
    a replica circuit comprising an inverter with output connected to input, configured to generate a first voltage upon dumping a second current onto the replica circuit;
    a first operational transconductance amplifier (OTA) with an input as the first voltage, configured to generate a third current; and
    a current mirror circuit configured to generate a fourth current by adding the first current and the third current in a particular ratio M:N;
    wherein the inverter of the replica circuit is equivalent to a single stage of the ring oscillator circuit, and
    wherein the fourth current is the total current for the ring oscillator circuit and is set to be approximately equal to S times the second current.

2. The frequency stable oscillator of claim 1, wherein the current generator circuit comprises a second operational transconductance amplifier (OTA2) based feedback loop.

3. The frequency stable oscillator of claim 2, wherein the feedback loop of the current generator circuit comprises a 1:K current mirror circuit wherein value of 'K' is determined upfront and is fixed.

4. The frequency stable oscillator of claim 3, wherein the ratio 1:K is fixed by a resistor.

5. The frequency stable oscillator of claim 1, wherein the first OTA has a second input as bias voltage of a variable resistance with trimmable bits.

6. The frequency stable oscillator of claim 5, wherein the trimmable bits of the variable resistance of the variable resistance are obtained from an on-chip e-fuse bank.

7. The frequency stable oscillator of claim 1, wherein the first OTA has bias current as the output current of the current generator circuit.

8. The frequency stable oscillator of claim 1, wherein the ratio M:N is selected by inputting trim bits to a decoder.

9. The frequency stable oscillator of claim 1, wherein the ratio M:N is once selected at the testing stage and then burned as a fixed value for the operation of the oscillator.

10. The frequency stable oscillator of claim 1, further comprising a level shifter connected to the output of the ring oscillator circuit.

11. The frequency stable oscillator of claim 1, wherein the current generator circuit comprises a start-up circuit.

12. The frequency stable oscillator of claim 1, wherein S is an odd number and each stage of the ring oscillator circuit comprises an inverter.

13. The frequency stable oscillator of claim 12, wherein the inverter of each stage of the ring oscillator circuit comprises a pmos transistor and a nmos transistor.

14. The frequency stable oscillator of claim 13, wherein the pmos transistor and the nmos transistor are sized to have the switching threshold equal to half a supply voltage of the ring oscillator circuit.

15. A method of frequency stabilization of a ring oscillator circuit, comprising:
generating a first current by a current generator circuit;
generating a first voltage by dumping a second current onto a replica circuit, wherein the replica circuit comprises an inverter with output connected to input and the inverter of the replica circuit is equivalent to a single stage of the ring oscillator circuit;
generating a third current by voltage to current conversion of the first voltage; and
generating a fourth current by adding the first current and the third current in a particular ratio M:N, wherein the fourth current is the total current for the ring oscillator circuit and is set to be approximately equal to the second current multiplied with number of stages in the ring oscillator circuit.

16. The method of claim 15, further comprising level shifting the output frequency of the ring oscillator circuit to a core supply voltage level.

17. The method of claim 16, wherein the voltage to current conversion for generating the third current is performed using a first operational transconductance amplifier (OTA).

18. The method of claim 16, wherein the first current is generated by the current generator circuit using a second operational transconductance amplifier (OTA2) based feedback loop.

19. The method of claim 17, further comprising inputting a bias voltage of a variable resistance with trimmable bits to the first operational transconductance amplifier OTA.

20. The method of claim 15, wherein the first current and the third current are directly and inversely proportional to temperature respectively.

21. The method of claim 15, wherein the ratio M:N is once selected at the testing stage and then burned as a fixed value.

22. The method of claim 15, wherein the first voltage is set to be approximately equal to a supply voltage of the ring oscillator circuit.

23. The method of claim 15, wherein the first current is insensitive to the power supply variation.

24. The method of claim 15, wherein the first voltage captures process variation in the resistance of the ring oscillator circuit.

25. The method of claim 15, wherein the resistance of the replica circuit is equal to resistance of a single stage of the ring oscillator circuit.

26. A low power frequency stable on-chip CMOS oscillator comprising:
a ring oscillator circuit with S number of stages and each stage comprising an inverter;
a current generator circuit configured to generate a first current, insensitive to power supply variations;
a replica circuit comprising an inverter with output connected to input, configured to generate a first voltage by dumping a second current onto the replica circuit;
an operational transconductance amplifier (OTA) with inputs as the first voltage and a bias voltage of a variable resistance with trimmable bits, with bias current as one of the output current of the current generator, configured to generate a third current; and
a current mirror circuit configured to generate a fourth current by adding the first current and the third current in a particular ratio M:N;
wherein the fourth current is the total current for the ring oscillator circuit and is set to be approximately equal to S times the second current,
wherein the inverter of the replica circuit is equivalent to a single stage of the ring oscillator circuit and
wherein the first and third current are directly and inversely proportional to the temperature respectively.

* * * * *